United States Patent
Chao et al.

(10) Patent No.: US 9,691,671 B2
(45) Date of Patent: Jun. 27, 2017

(54) TEST KEY ARRAY

(71) Applicant: UNITED MICROELECTRONICS CORP., Hsin-Chu (TW)

(72) Inventors: Tse-Min Chao, Taichung (TW); Tzu-Yun Chang, Hsin-Chu Hsien (TW); Hsueh-Chun Hsiao, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 420 days.

(21) Appl. No.: 14/472,348

(22) Filed: Aug. 28, 2014

(65) Prior Publication Data

US 2016/0064295 A1 Mar. 3, 2016

(51) Int. Cl.
*H01L 21/66* (2006.01)

(52) U.S. Cl.
CPC .................................... *H01L 22/34* (2013.01)

(58) Field of Classification Search
CPC .......... H01L 22/34; H01L 22/32; H01L 22/22
See application file for complete search history.

(56) References Cited

U.S. PATENT DOCUMENTS

| 5,051,690 | A | * | 9/1991 | Maly | ................... | G01R 31/024 |
| | | | | | | 257/48 |
| 5,262,719 | A | | 11/1993 | Magdo | | |
| 6,521,910 | B1 | | 2/2003 | Lin | | |

* cited by examiner

*Primary Examiner* — Nikolay Yushin
(74) *Attorney, Agent, or Firm* — Winston Hsu

(57) ABSTRACT

The present invention provides a test key array including a lower conductive pattern, and the lower conductive pattern includes a plurality of first L-shaped traces parallel to each other, an upper conductive pattern, where the upper conductive pattern includes a plurality of second L-shaped traces parallel to each other, the lower conductive pattern crosses to the upper conductive pattern, and a plurality of cross regions are defined between the lower conductive pattern and the upper conductive pattern, and a plurality of conductive plugs, disposed on parts of the cross regions, electrically connecting to the lower conductive pattern and the upper conductive pattern.

18 Claims, 4 Drawing Sheets

TEST KEY ARRAY

BACKGROUND OF THE INVENTION

1. Field of the Invention

The present invention generally relates to a test key array on a wafer, and more particularly, to a test key array on a wafer for wafer acceptable test (hereinafter abbreviated as WAT).

2. Description of the Prior Art

In the standard semiconductor process, in order to evaluate the efficiency of each procedure and to confirm performance of the elements after the procedures, a WAT is performed on the wafers. The WAT includes an electrical test on the test pad structure disposed around the peripheral regions of the dice. And by analyzing the feedback signal, the stability of the semiconductor processes is confirmed as well as the characteristics and performance of each device of the dice.

Prior to the WAT, test keys are formed in the scribe lines around the dice. A device formed in a die is usually for logic computation or for memory, while a similar device is also formed in the scribe line as a part of the test key. The state-of-the-art also provides test pads electrically connected to the test keys. Accordingly, the test keys are electrically connected to an external circuit or probes of a probe card through the test pads to check the quality of the IC process in the WAT. After the WAT, a dicing process is performed to individualize each die on the wafer.

A dual damascene process is a method of forming a conductive wire coupled with a via plug in a dielectric layer. The dual damascene structure, comprising an upper wire and a lower via plug, is used to connect devices and wires in a semiconductor wafer and is insulated with other devices by the inter-layer dielectrics (ILD) around it. With the progress of the semiconductor fabrication and the miniaturization of the devices, size of the die and width of the scribe lines are consequently shrunk. Therefore, the dual damascene structure may make it easier to contact others devices or wires when some manufacturing defects occur, such as the over-etching defect or the misalignment defects. FIGS. 1A and 1B are schematic diagrams showing an over-etching issue happening in a dual damascene structure. As shown in FIG. 1, a via plug 1 is disposed in a dielectric layer 2, and electrically connected to a lower metal layer M1 and an upper metal layer M2, and especially connects the trace M1B of the lower metal layer M1, but does not contact the adjacent traces M1 or M1C directly. However, when an over-etching issue happens, as shown in FIG. 1B, the via plug 1 may contact the adjacent traces, and the issue mentioned above can happen more easily when the size of the die and width of the scribe lines are consequently shrunk.

SUMMARY OF THE INVENTION

The present invention provides a test key array comprising a lower conductive pattern, wherein the lower conductive pattern includes a plurality of first L-shaped traces parallel to each other, an upper conductive pattern, wherein the upper conductive pattern includes a plurality of second L-shaped traces parallel to each other. In addition, the lower conductive pattern crosses to the upper conductive pattern, and a plurality of cross regions are defined between the lower conductive pattern and the upper conductive pattern. A plurality of conductive plugs, disposed on parts of the cross regions, electrically connect to the lower conductive pattern and the upper conductive pattern.

The present invention further provides a test key array comprising a lower conductive pattern, wherein the lower conductive pattern includes a plurality of first L-shaped traces parallel to each other, an upper conductive pattern, wherein the upper conductive pattern includes a plurality of second L-shaped traces parallel to each other. In addition, the lower conductive pattern crosses to the upper conductive pattern, and a plurality of cross regions are defined between the lower conductive pattern and the upper conductive pattern, and at least one of the cross region includes a conductive plug array disposed thereon. Each conductive plug array includes a plurality of conductive plugs, electrically connecting to the lower conductive pattern and the upper conductive pattern.

The present invention provides a test key array, and the test key array has a novel structure, especially comprising a plurality of first L-shaped traces and a plurality of second L-shaped traces crossed to each other, and a plurality of conductive plugs electrically connecting to the lower conductive pattern and the upper conductive pattern. Therefore, the user can determine whether the defects such as the misalignment or the over-etching occur or not in the vertical direction and in the horizontal direction simultaneously by detecting the first pad and the second pad.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 2:
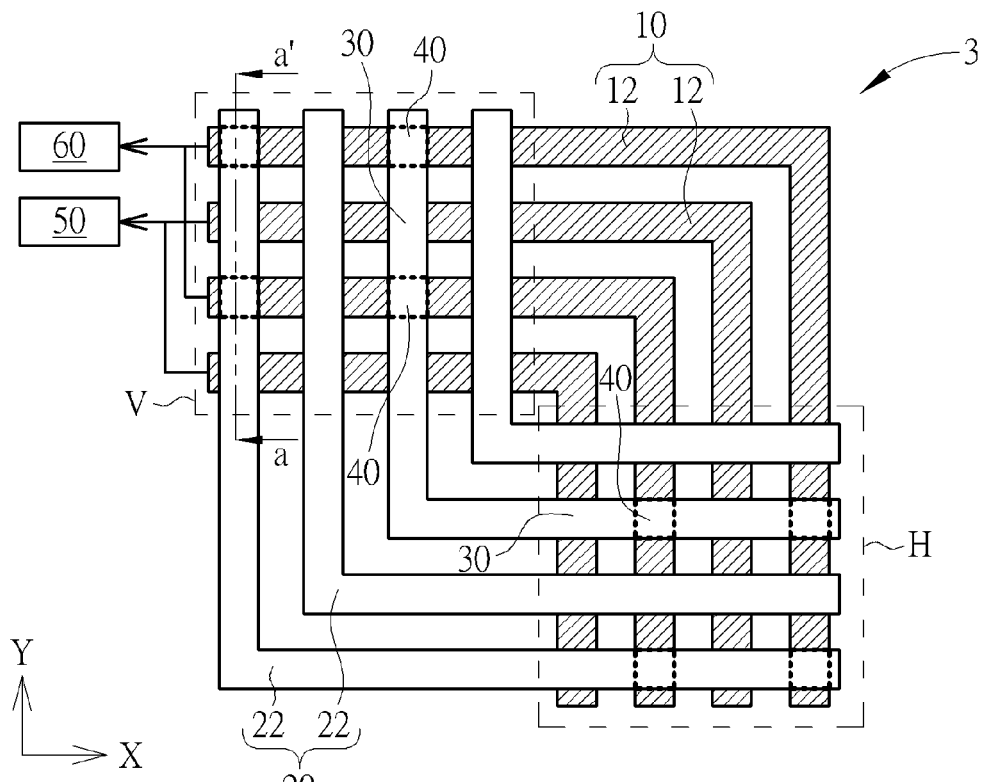
FIG. 2 is a top view diagram showing the test key array of the first preferred embodiment of the present invention.

FIG. 2 is a top view diagram showing the test key array of the first preferred embodiment of the present invention. As shown in FIG. 2, the test key 3 comprises a lower conductive pattern 10, wherein the lower conductive pattern 10 includes a plurality of first L-shaped traces 12 parallel to each other; an upper conductive pattern 20, wherein the upper conductive pattern 20 includes a plurality of second L-shaped traces 22 parallel to each other, wherein in this embodiment, each second L-shaped trace 22 is an "up-side-down L shaped structure". Therefore, the lower conductive pattern 10 crosses to the upper conductive pattern 20, and a plurality of cross regions 30 are defined between the lower conductive pattern 10 and the upper conductive pattern 20.

Figure 3:
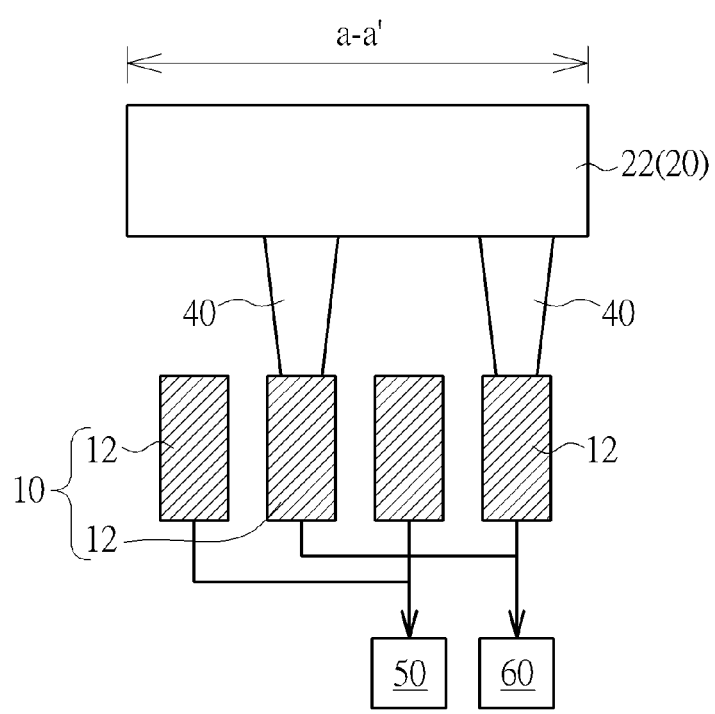
FIG. 3 is a cross section diagram along the cross line A-A' in FIG. 2.

Besides, FIG. 3 is a cross section diagram along the cross line A-A' in FIG. 2. As shown in FIG. 3, the lower conductive pattern 10 and the upper conductive pattern 20 are disposed on different levels, and the test key array 3 of the present invention further comprises a plurality of conductive plugs 40, disposed on parts of the cross regions 30, electrically connecting to the lower conductive pattern 10 and the upper conductive pattern 20. In other words, in the present embodiment, there is a plurality of cross regions 30 arranged in a matrix, but only parts of these cross regions 30 have conductive plugs 40 disposed thereon. More precisely, in the present invention, if one cross region has one conductive plug 40 disposed thereon (such as the cross region A shown in FIG. 2), other cross regions 30 adjacent to the cross region A, especially the cross regions 30 disposed on two sides of the cross region A along the X-axis and the Y-axis, do not comprise any conductive plugs 40. In short, when viewed in top view, the conductive plugs 40 are arranged like a "checkerboard".

In addition, the present invention further comprises a first pad 50 and a second pad 60, electrically connecting to the lower conductive pattern 10. The first pad 50 and the second pad 60 are metal pads or others pads made of conductive materials. The first pad 50 and the second pad 60 can be used for electrically connecting to the probes for detecting signals from the test key array. In the present embodiment, if one first L-shaped traces 12 is electrically connected to the first pad 50, the other first L-shaped traces 12 adjacent to the one first L-shaped traces 12 will be electrically connected to the second pad 60. More precisely, the lower conductive pattern 10 comprises a plurality of first L-shaped traces 12 parallel to each other, each first L-shaped trace 12 which electrically connects to the first pad 50 is disposed between two first L-shaped traces 12 which electrically connect to the second pad 60, and similarly, each first L-shaped trace 12 which electrically connects to the second pad 60 is disposed between two first L-shaped traces 12 which electrically connect to the first pad 50.

Figure 1A:
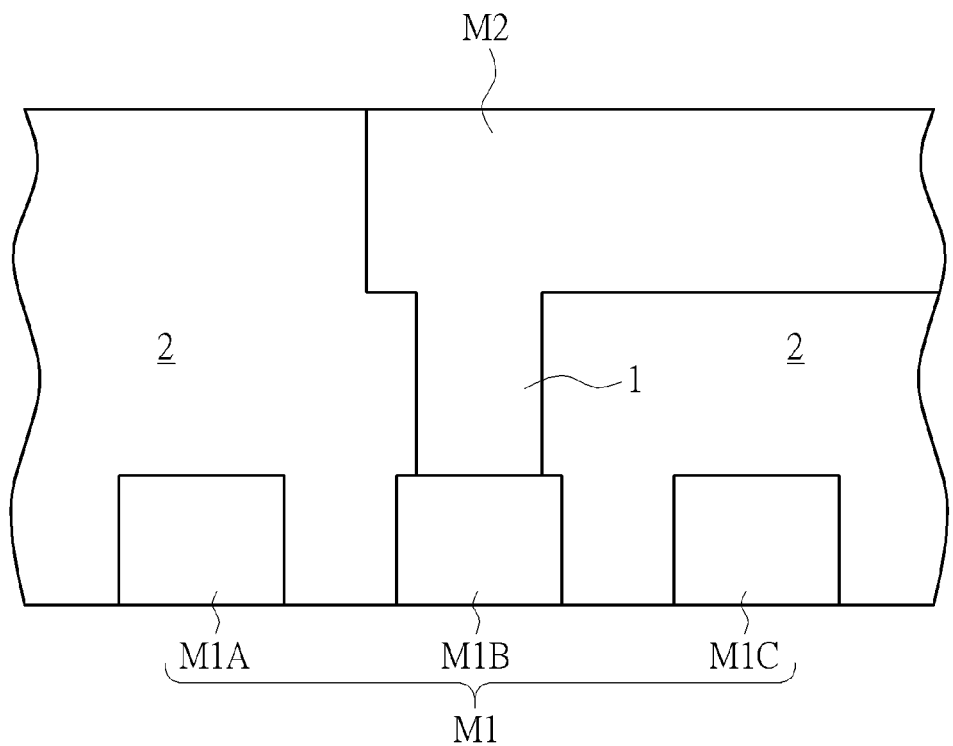
FIGS. 1A and 1B are schematic diagrams showing an over-etching issue happening in a dual damascene structure.
Figure 1B:
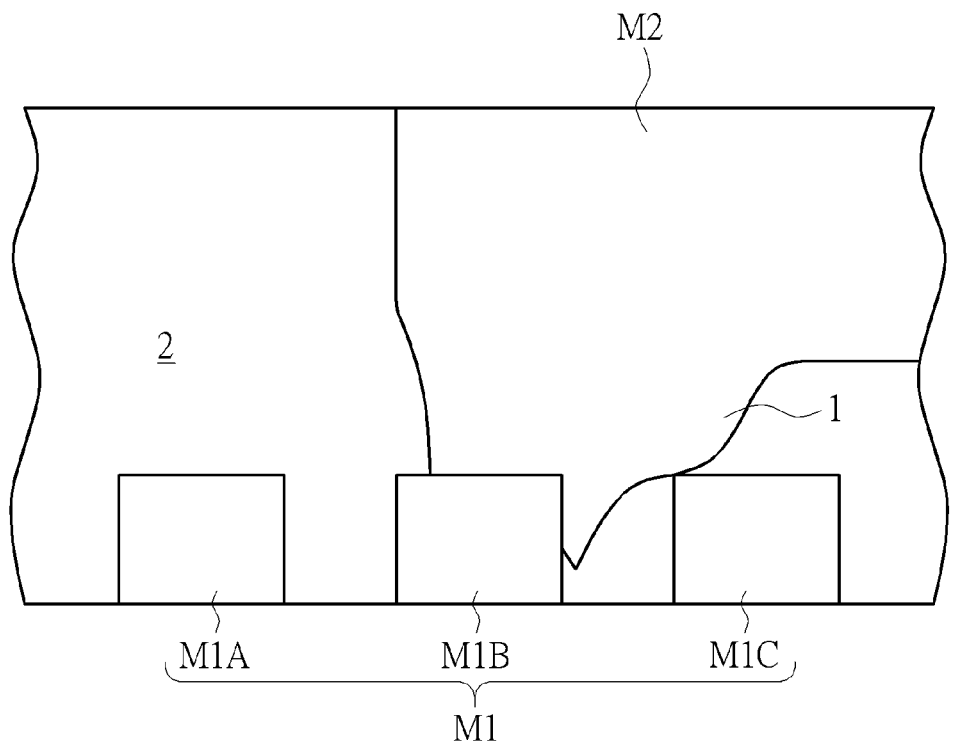

In the present invention, please refer to FIGS. 2~3, when viewed in top view, the test key has two regions: region V and region H, wherein the region V is used for detecting the misalignment or the over-etching issues occurring in the vertical direction (Y-axis), and the region H is used for detecting the misalignment or the over-etching issues occurring in the horizontal direction (X-axis). Take FIG. 3 as an example, as shown in FIG. 3, the conductive plugs 40 are disposed on the first L-shaped traces 12 which electrically connect to the second pad 60. Since the conductive plugs 40 does not contact the first L-shaped traces 12 which electrically connected to the first pad 50, the first pad 50 cannot detect any signal in a normal case. However, if some defects like the over-etching (such as the defects shown in FIG. 1B), the misalignment or the blind hole, wherein a blind hole refers to a hole that is etched, but without breaking through to the other side of the layer, occur in the vertical direction, the conductive plug 40 may not only contact the first L-shaped traces 12 which electrically connect to the second pad 60, but also contacts the first L-shaped traces 12 which electrically connect to the first pad 50. In that case, the first pad 50 may detect some signals. So the user can determine whether the defects such as the misalignment and the over-etching occur or not in the vertical direction by detecting the first pad 50 and the second pad 60. Similarly, within the region H, the user can determine whether the defects mentioned above occur or not in the horizontal direction by detecting the first pad 50 and the second pad 60 too. In the present invention, the user may determine whether the defects such as the misalignment or the over-etching occur or not in the vertical direction and in the horizontal direction simultaneously by detecting the first pad 50 and the second pad 60, and if combining with other detecting methods, such as the measuring the potential drop or the currents, the user can further determine in which direction the defects occurred.

In the embodiment mentioned above, the first pad 50 and the second pad 60 are electrically connected to the lower conductive pattern 10, but the present invention is not limited thereto, in other preferred embodiment of the present invention, the first pad 50 and the second pad 60 may also electrically connect to the upper conductive pattern 20, and it should be comprised in the scope of the present invention.

Figure 4:
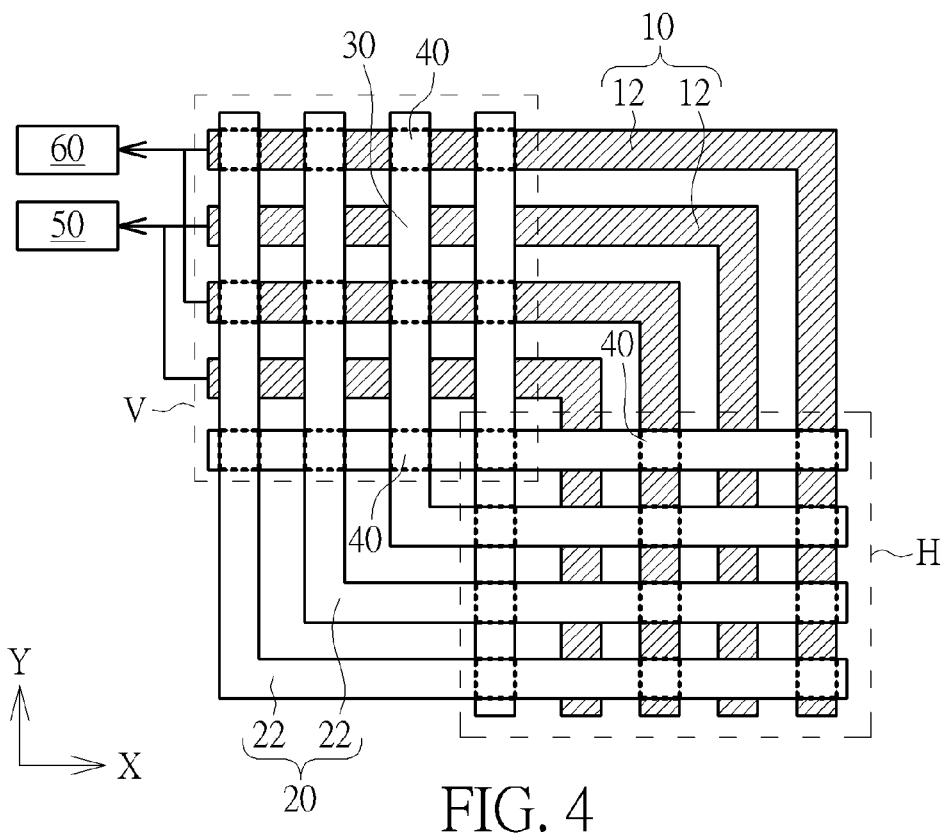
FIG. 4 is a top view diagram showing the test key array of another embodiment of the present invention.

In the embodiment mentioned above, if one cross region has one conductive plug 40 disposed thereon (such as the cross region A shown in FIG. 2), other cross regions 30 adjacent to the cross region A, especially the cross regions 30 disposed on two sides of the cross region A along the X-axis and the Y-axis, do not comprise any conductive plugs 40. In short, when viewed in top view, the conductive plugs 40 are arranged like a "checkerboard". However, in another embodiment of the present invention, FIG. 4 is a top view diagram showing the test key array of another embodiment of the present invention. As shown in FIG. 4, the conductive plugs 40 are disposed on every adjacent cross region 30. More precisely, within the region V, the conductive plugs 40 are disposed on disposed on every cross region 30 along the X-direction, and within the region H, the conductive plugs 40 are disposed on disposed on every cross region 30 along the Y-direction.

Figure 5:
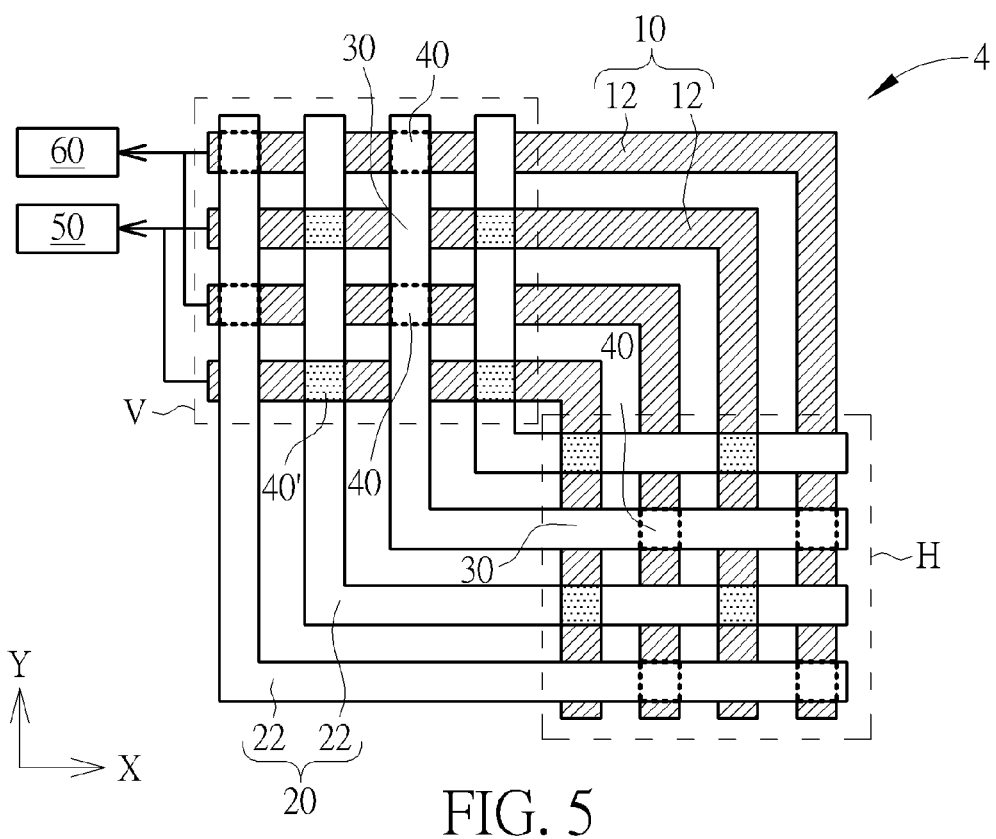
FIG. 5 is an example showing the test key applied in a multiple layer stacked structure.

The test key array of the present invention can be a stacked structure. For example, please refer to FIG. 5. FIG. 5 is an example showing the test key applied in a multiple layer stacked structure. The structure of the test key 4 is similar to the test key 3 (shown in FIG. 2) mentioned above, but the test key 4 is a multiple layer stacked structure, further comprising a plurality of conductive plugs 40' disposed on the upper conductive pattern 20. It is worth noting that each conductive plugs 40' is not disposed "right above" the conductive plugs 40 disposed below. And another conductive pattern (not shown) is disposed on the conductive plugs 40' and the upper conductive pattern 20 to form the multiple layer stacked structure.

Preferably, in the manufacturing process for forming the test key of the present invention, the second L-shaped traces 22 and the conductive plugs 40 are formed monolithically. In other words, the second L-shaped traces 22 and the conductive plugs 40 are formed simultaneously and comprise the same material. Besides, the thickness of each second L-shaped trace 22 is preferably larger than the thickness of each first L-shaped trace 12, in addition, the first L-shaped traces 12 and the second L-shaped traces 22 preferably comprise copper traces, but the present invention is not limited thereto.

Figure 6:
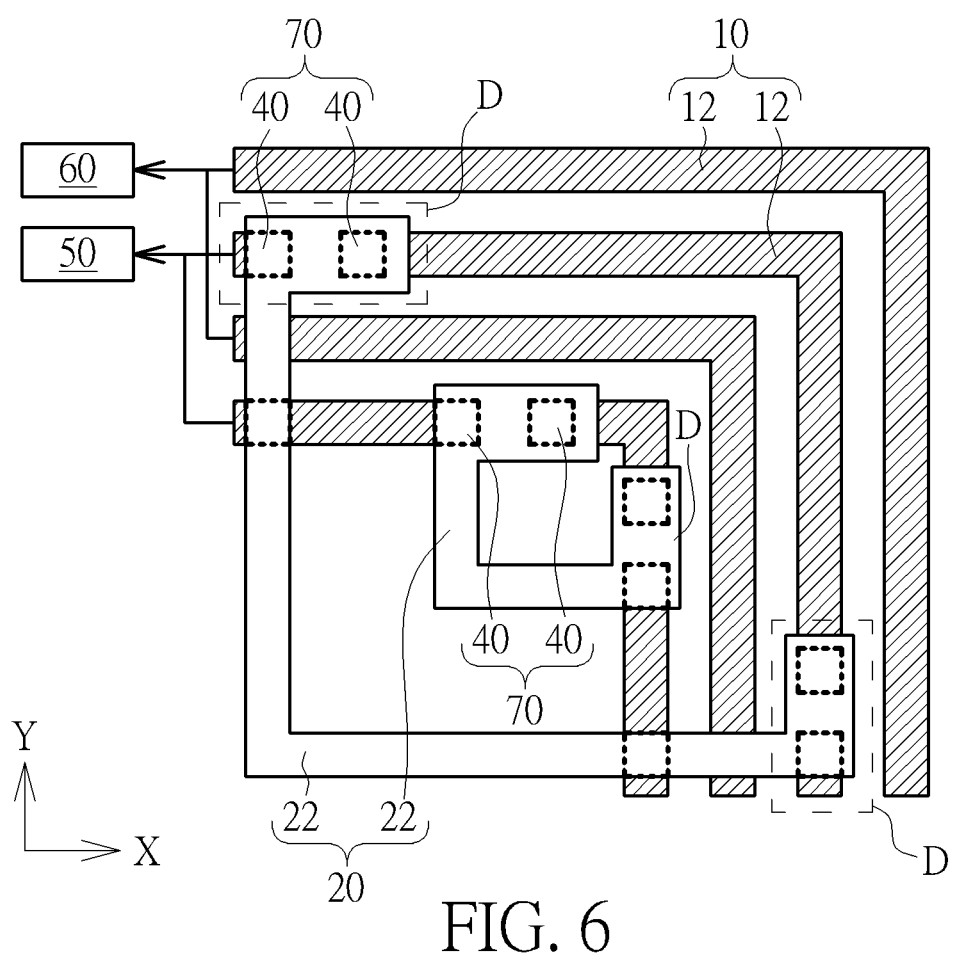
FIG. 6 is a top view diagram showing the test key array of the second preferred embodiment of the present invention.

Please refer to FIG. 6, FIG. 6 is a top view diagram showing the test key array of the second preferred embodiment of the present invention. In this embodiment, the upper conductive pattern 20 comprises a plurality of second L-shaped traces 22 parallel to each other, and each second L-shaped trace 22 of the upper conductive pattern 20 has two terminal regions D, and the width of the second L-shaped trace 22 within the terminal region D is larger than other widths of the second L-shaped traces 22. Besides, the arranged direction of the second L-shaped traces 22 is parallel to the arranged direction of the first L-shaped traces 12 within the terminal region D. Therefore, the second L-shaped trace 22 has larger area within the terminal region D. In this embodiment, each terminal region may comprise a conductive plug array 70 or only one conductive plug 40, wherein each conductive plug array 70 includes a plurality of conductive plugs 40. More precisely, in the first preferred embodiment mentioned above, if one cross region 30 has the conductive plug 40 disposed thereon, this cross region 30 comprises only one conductive plug 40 disposed thereon, but in this embodiment, the terminal region D comprises a plurality of conductive plugs 40 disposed thereon. In the general situation, the over-etching defect is more likely to occur during manufacturing process for forming the conductive plug array than forming only one conductive plug. Therefore, in this embodiment, the terminal region D has a larger area, for accumulating a plurality of conductive plugs 40 (the conductive plug array 70), so as to detect whether the defects, such as over-etching, will occur or not when forming the conductive plug array 70. The other components, material properties, and manufacturing method of the test key array are similar to those of the first preferred embodiment detailed above and will not be redundantly described.

In summary, the present invention provides a test key array, and the test key array has novel structure, especially comprising a plurality of first L-shaped traces and a plurality of second L-shaped traces crossed to each other, and a plurality of conductive plugs electrically connecting to the lower conductive pattern and the upper conductive pattern. Therefore, the user can determine whether the defects such as the misalignment or the over-etching occur or not in the vertical direction and in the horizontal direction simultaneously by detecting the first pad and the second pad.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A test key array, comprising:
   a lower conductive pattern, wherein the lower conductive pattern includes a plurality of first L-shaped traces parallel to each other;
   an upper conductive pattern, wherein the upper conductive pattern includes a plurality of second L-shaped traces parallel to each other, wherein, the lower conductive pattern crosses to the upper conductive pattern, and a plurality of cross regions are defined between the lower conductive pattern and the upper conductive pattern; and
   a plurality of conductive plugs, disposed on parts of the cross regions, electrically connecting to the lower conductive pattern and the upper conductive pattern, wherein the second L-shaped traces and the conductive plugs are formed monolithically.

2. The test key array of claim 1, wherein the lower conductive pattern and the upper conductive pattern are disposed on different levels.

3. The test key array of claim 1, further comprising a first pad and a second pad, electrically connecting to the lower conductive pattern.

4. The test key array of claim 3, wherein one first L-shaped trace of the lower conductive pattern is electrically connected to the first pad, and the other first L-shaped traces adjacent to the first L-shaped trace are electrically connected to the second pad.

5. The test key array of claim 1, wherein one cross region has the conductive plug disposed thereon, and the other cross regions adjacent to the one cross region do not have conductive plugs disposed thereon.

6. The test key array of claim 1, wherein one cross region has the conductive plug disposed thereon, and only one conductive plug on the cross region.

7. The test key array of claim 1, wherein each second L-shaped trace of the upper conductive pattern has two terminal regions, and the width of the second L-shaped trace within each of the two terminal regions is larger than other widths of the second L-shaped traces.

8. The test key array of claim 7, wherein an arranged direction of the second L-shaped traces is parallel to an arranged direction of the first L-shaped traces within the terminal region.

9. The test key array of claim 1, wherein the thickness of each second L-shaped trace is larger than the thickness of each first L-shaped trace.

10. The test key array of claim 1, wherein the first L-shaped traces and the second L-shaped traces comprise copper traces.

11. A test key array, comprising:
    a lower conductive pattern, wherein the lower conductive pattern includes a plurality of first L-shaped traces parallel to each other;
    an upper conductive pattern, wherein the upper conductive pattern includes a plurality of second L-shaped traces parallel to each other, wherein, the lower conductive pattern crosses to the upper conductive pattern, and a plurality of cross regions are defined between the lower conductive pattern and the upper conductive pattern; and
    at least one of the cross regions includes a conductive plug array disposed thereon, and each conductive plug array includes a plurality of conductive plugs, electrically connecting to the lower conductive pattern and the upper conductive pattern.

12. The test key array of claim 11, wherein the lower conductive pattern and the upper conductive pattern are disposed on different levels.

13. The test key array of claim 11, further comprising a first pad and a second pad, electrically connecting to the lower conductive pattern.

14. The test key array of claim 13, wherein one first L-shaped trace of the lower conductive pattern is electrically connected to the first pad, and the other first L-shaped traces adjacent to the first L-shaped trace are electrically connected to the second pad.

15. The test key array of claim 11, wherein one cross region has the conductive plug disposed thereon, and the other cross regions adjacent to the one cross region do not have conductive plugs disposed thereon.

16. The test key array of claim 11, wherein the second L-shaped traces and the conductive plugs are formed monolithically.

17. The test key array of claim 11, wherein each second L-shaped trace of the upper conductive pattern has two terminal regions, and the width of the second L-shaped trace within each of the two terminal regions is larger than other widths of the second L-shaped traces.

18. The test key array of claim 17, wherein an arranged direction of the second L-shaped traces is parallel to an arranged direction of the first L-shaped traces within the terminal region.

\* \* \* \* \*